(12) United States Patent
Lin et al.

(10) Patent No.: US 9,190,435 B2
(45) Date of Patent: Nov. 17, 2015

(54) SHARED ACTIVE PIXEL SENSOR

(71) Applicant: Himax Imaging Limited, Tainan (TW)

(72) Inventors: Dong-Long Lin, Tainan (TW);
Chung-Ren Li, Tainan (TW);
Chung-Wei Chang, Tainan (TW)

(73) Assignee: Himax Imaging Limited, Xinshi Dist., Tainan (TW)

( * ) Notice: Subject to any disclaimer, the term of this patent is extended or adjusted under 35 U.S.C. 154(b) by 0 days.

(21) Appl. No.: 14/201,913

(22) Filed: Mar. 9, 2014

(65) Prior Publication Data

US 2015/0255497 A1 Sep. 10, 2015

(51) Int. Cl.
*H01L 27/146* (2006.01)

(52) U.S. Cl.
CPC .... *H01L 27/14605* (2013.01); *H01L 27/14612* (2013.01); *H01L 27/14643* (2013.01)

(58) Field of Classification Search
CPC .............. H01L 27/14605; H01L 27/14643; H01L 27/14612
See application file for complete search history.

(56) References Cited

U.S. PATENT DOCUMENTS

| | | | | |
|---|---|---|---|---|
| 8,338,868 | B2 * | 12/2012 | Mheen et al. | H01L 27/14603 257/204 |
| 2012/0257093 | A1 * | 10/2012 | Sa et al. | 348/302 |

\* cited by examiner

*Primary Examiner* — Julio J Maldonado
*Assistant Examiner* — Farun Lu
(74) *Attorney, Agent, or Firm* — Winston Hsu; Scott Margo

(57) ABSTRACT

A shared active pixel sensor with a shared photodiode, a shared sense node, a transfer gate, a shared reset gate and a shared source follower gate is disclosed. A shared photodiode includes at least a first signal node and a second signal node. A shared sense node electrically connected to the shared photodiode. A transfer gate disposed between the first signal node and the shared sense node to control the first signal node and the shared sense node. A shared reset gate is electrically connected to the shared sense node and a shared source follower gate reads a photocurrent from the shared photodiode.

11 Claims, 2 Drawing Sheets

SHARED ACTIVE PIXEL SENSOR

BACKGROUND OF THE INVENTION

1. Field of the Invention

The present invention generally relates to a shared active pixel sensor (APS). In particular, the present invention is directed to a shared active pixel sensor so that a single multi-share pixel unit can serve as multiple pixels.

2. Description of the Prior Art

A photodiode is a semiconductor device for use as an image sensor. Basically speaking, to make an image sensor more sensitive, it is a good idea for a photodiode to occupy an area as large as possible so regions other than the photodiode region in each pixel should be minimized. For the sake of saving more pixel area, pixels are always designed to share read out circuits with other neighboring pixels.

In terms of the number of sharing pixels, there are various sharing pixels, for example a 2-share or a 4-share pixel. Generally speaking, a reset transistor or a source follower is the first candidacy. Otherwise, it is only one option available to reduce the STI (shallow trench isolation) area or the floating diffusion area to achieve a high conversion gain or high sensing area.

Accordingly, another novel pixel structure is still needed for minimizing the pixel area.

SUMMARY OF THE INVENTION

The present invention proposes a new shared active pixel sensor structure for minimizing the pixel area. The combined photodiode or reducing the transistor numbers is another possible solution of the present invention.

The present invention proposes a new shared active pixel sensor (APS). The new shared active pixel sensor includes a first shared photodiode, a first shared sense node, a first transfer gate, a first shared reset gate and a first shared source follower gate. The first shared photodiode includes at least a first signal node and a second signal node. The first shared sense node is electrically connected to the first shared photodiode. The first transfer gate is disposed between the first signal node and the first shared sense node so that the first signal node and the first shared sense node together serve as a source and a drain which are controlled by the first transfer gate. The first shared reset gate is electrically connected to the first shared sense node. The first shared source follower gate reads a photocurrent from the first shared photodiode.

In one embodiment of the present invention, the first signal node and the second signal node are respectively disposed at different corners of the first shared photodiode.

In another embodiment of the present invention, the first shared photodiode further includes a third signal node and a fourth signal node.

In another embodiment of the present invention, only one of the first signal node, the second signal node, the third signal node and the fourth signal node is switched on at one time.

In another embodiment of the present invention, the first shared reset gate, the first shared source follower gate and the first transfer gate operate sequentially to control the first signal node and the first shared sense node.

In another embodiment of the present invention, the shared active pixel sensor further includes a second shared photodiode, a fifth transfer gate and a second shared source follower gate. The second shared photodiode includes a fifth signal node electrically connected to the first shared sense node. The fifth transfer gate is disposed between the fifth signal node and the first shared sense node so that the fifth signal node and the first shared sense node together serve as a source and drain pair controlled by the fifth transfer gate. The second shared source follower gate to read a photocurrent from the second shared photodiode.

In another embodiment of the present invention, the first shared sense node is disposed between the second shared source follower gate and the first shared source follower gate.

In another embodiment of the present invention, the first shared sense node is electrically connected to at most four transfer gates of different shared photodiodes.

In another embodiment of the present invention, the first shared reset gate is disposed between the first shared photodiode and the second shared photodiode.

In another embodiment of the present invention, the shared active pixel sensor further includes a second shared sense node, a second shared reset gate, a third shared source follower gate and a fourth shared source follower gate. The second shared sense node is electrically connected to the second signal node, and controlled by a second transfer gate of the first shared photodiode. The second transfer gate is disposed between the second signal node and the second shared sense node. The second shared sense node is electrically connected to a sixth signal node of the second photodiode and controlled by a sixth transfer gate of the second shared photodiode. The sixth transfer gate is disposed between the sixth signal node and the second shared sense node. The second shared reset gate is electrically connected to the second shared sense node. The third shared source follower gate is disposed adjacent to the second transfer gate to read a photocurrent from the first shared photodiode. The fourth shared source follower gate is disposed adjacent to the sixth transfer gate to read a photocurrent from the second shared photodiode.

In another embodiment of the present invention, the shared active pixel sensor independently operates as four pixels by means of the first signal node, the second signal node, the third signal node and the fourth signal node.

The present invention again proposes another shared active pixel sensor. The new shared active pixel sensor includes a first shared photodiode, a first shared sense node, a first transfer gate, a first shared reset gate and a first shared source follower gate. The first shared photodiode consists of a first signal node and a second signal node. The first shared sense node is electrically connected to the first shared photodiode. The first transfer gate is disposed between the first signal node and the first shared sense node so that the first signal node and the first shared sense node together serve as a source and a drain controlled by the first transfer gate. The first shared reset gate is electrically connected to the first shared sense node. The first shared source follower gate is capable of reading a photocurrent from the first shared photodiode.

In one embodiment of the present invention, the first signal node and the second signal node are respectively disposed at different corners of the first shared photodiode.

In another embodiment of the present invention, only one of the first signal node and the second signal node is switched on at one time.

In another embodiment of the present invention, the first shared reset gate, the first shared source follower gate and the first transfer gate operate sequentially to control the first signal node and the first shared sense node.

In another embodiment of the present invention, the shared active pixel sensor further includes a second shared photodiode, a third transfer gate and a second shared source follower gate. The second shared photodiode includes a third signal node electrically connected to the first shared sense node. The third transfer gate is disposed between the third signal node and the first shared sense node so that the third signal node and the first shared sense node together serve as a source and drain pair controlled by the third transfer gate. The second shared source follower gate is capable of reading a photocurrent from the second shared photodiode.

In another embodiment of the present invention, the first shared reset gate is disposed between the second shared source follower gate and the first shared source follower gate.

In another embodiment of the present invention, the first shared sense node is electrically connected to two transfer gates of different shared photodiodes.

In another embodiment of the present invention, the shared active pixel sensor independently operates as two pixels by means of the first signal node and the second signal node.

These and other objectives of the present invention will no doubt become obvious to those of ordinary skill in the art after reading the following detailed description of the preferred embodiment that is illustrated in the various figures and drawings.

DETAILED DESCRIPTION

For minimizing the pixel area of a photodiode, the present invention provides a novel shared active pixel sensor. In the novel shared active pixel sensor, there are various shared elements which are shared by the adjacent pixel sensors to minimize the area occupied by element regions other than the photodiode region.

As used herein, terms including an ordinal such as "a first" or "a second" and the like may be used to explain various constitutional elements, but the constitutional elements are not limited thereto. The terms are used only to distinguish one constitutional element from another constitutional element. For example, a first constitutional element may be named as a second constitutional element, and similarly, a second constitutional element may be named as a first constitutional element, without departing from the right scope of the invention.

Figure 1:
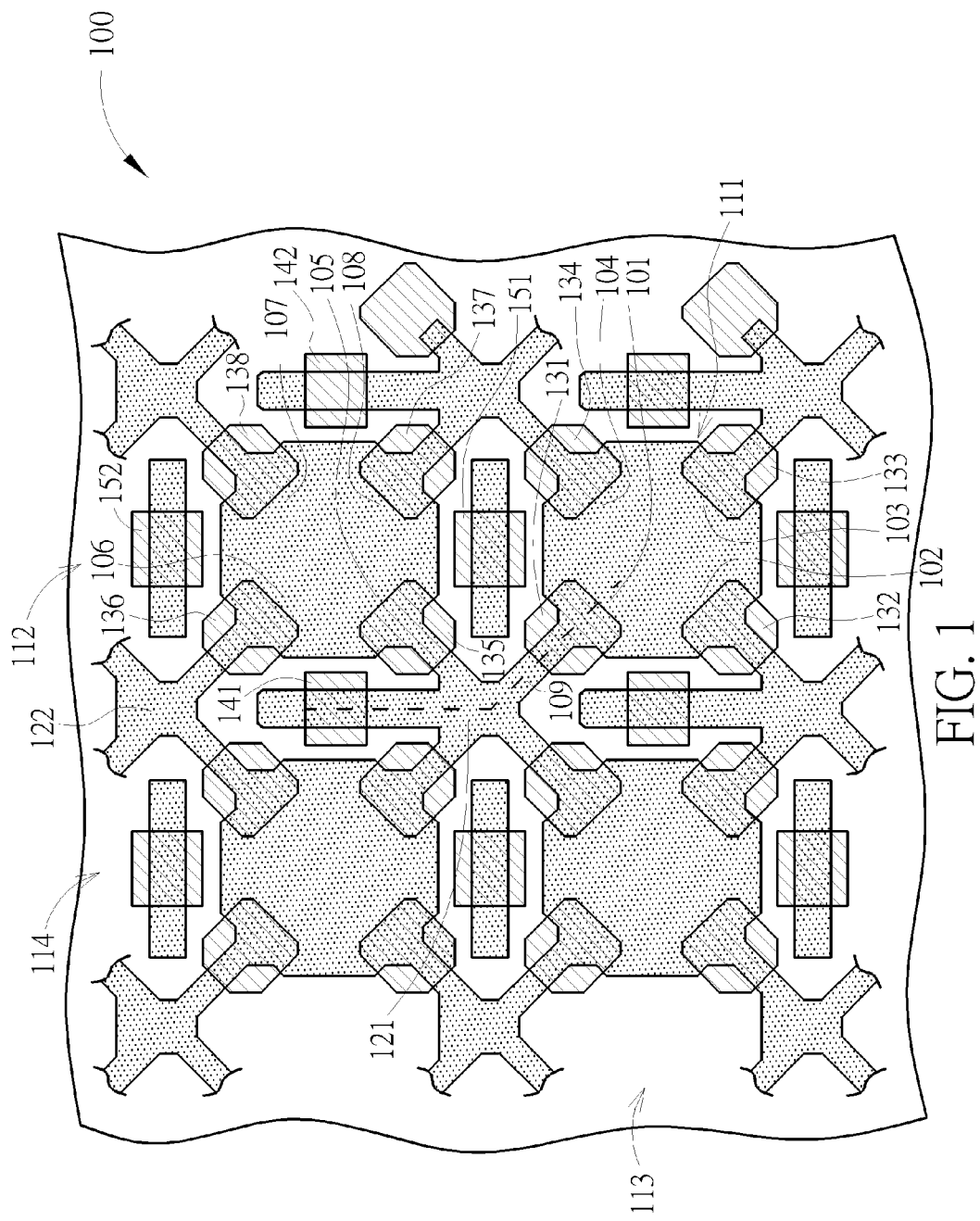
FIG. 1 illustrates one embodiment of the four-shared active pixel sensor layout structures in accordance with the present invention.
Figure 2:
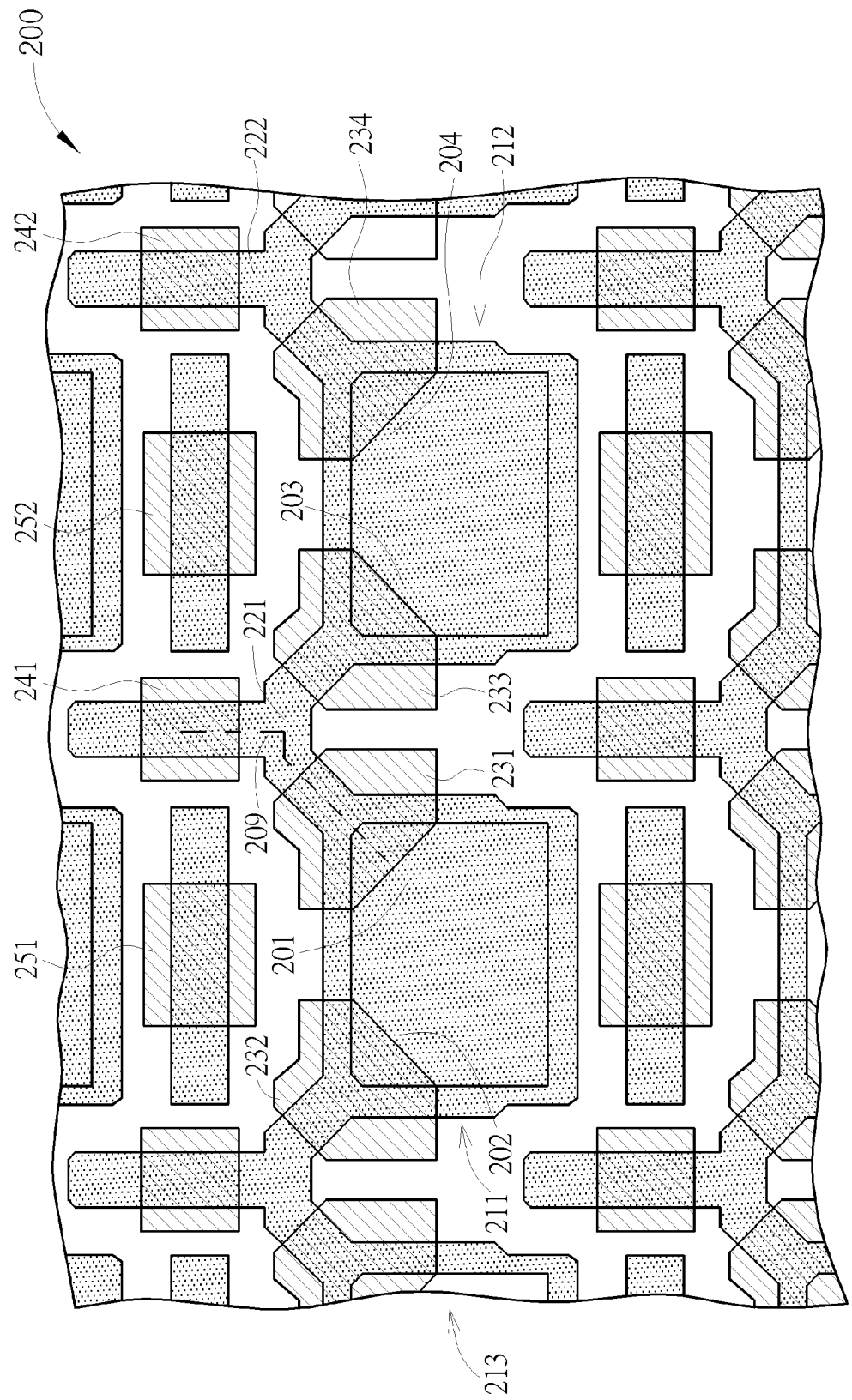
FIG. 2 illustrates one embodiment of the two-shared active pixel sensor layout structures in accordance with the present invention.

Please refer to FIG. 1 or FIG. 2. FIG. 1 and FIG. 2 respectively illustrate two possible shared active pixel sensor layout structures in accordance with the gist of the present invention. In FIG. 1, the shared active pixel sensor 100 of the present invention includes a first shared image sensor 111, a first shared sense node 121, a first transfer gate 131, a first shared reset gate 141 and a first shared source follower gate 151. In FIG. 2, the shared active pixel sensor 200 of the present invention includes a first shared image sensor 211, a first shared sense node 221, a first transfer gate 231, a first shared reset gate 241 and a first shared source follower gate 251.

The shared active pixel sensor of the present invention is a multi-shared photodiode with respect to the neighboring photodiode s. In other words, the multi-shared active photodiode is at least a two-shared image sensor 201 as shown in FIG. 2 or a four-shared image sensor 111 as shown in FIG. 1. For example, in FIG. 1, there are four four-shared image sensors, namely 111, 112, 113 and 114, illustrated in the shared active pixel sensor 100, and in FIG. 2, there are two two-shared image sensors, namely 211 and 212, illustrated in the shared active pixel sensor 200. Each shared image sensor in either FIG. 1 or FIG. 2 shares some elements with neighboring image sensors. In the following descriptions, the shared image sensors 111 and 211 are taken as exemplary shared active pixels.

Each shared image sensor includes at least two signal nodes, namely a first signal node and a second signal node. As shown in FIG. 1, image sensors are illustrated and the exemplary shared image sensor 111 which has a first signal node 101, a second signal node 102, a third signal node 103 and a fourth signal node 104 serves as a four-shared active photodiode.

Similarly as shown in FIG. 2, the photodiode 211 only needs a first signal node 201 and a second signal node 202. In other words, the photodiode 211 consists of a first signal node 201 and a second signal node 202 to serve as a two-shared photodiode.

In one embodiment of the present invention, each signal node is disposed at one corner of the image sensor so multiple signal nodes are respectively disposed at different corners in the same photodiode. For example, as shown in FIG. 2, the first signal node 201 and the second signal node 202 are respectively disposed at two different corners of the first shared image sensor 211. Or as shown in FIG. 1, the first signal node 101, the second signal node 102, the third signal node 103 and the fourth signal node 104 are respectively disposed at four different corners of the first shared image sensor 111.

As shown in FIG. 1, the first shared sense node 121 is disposed adjacent to and electrically connected to the first shared photodiode 111. Further, the first shared sense node 121 is disposed at a signal path 105 half way between the first shared image sensor 111 and the first shared reset gate 141. The first shared reset gate 141 is electrically connected to the first shared sense node 121. Similarly, as shown in FIG. 2, the first shared sense node 221 is disposed adjacent to and electrically connected to the first shared image sensor 211. Also, the shared sense node is disposed at a signal path 205 half way between the first shared photodiode 211 and the first shared reset gate 241. The first shared reset gate 241 is electrically connected to the first shared sense node 221. Generally, a shared reset gate is in charge of the accumulation of a charge at one shared sense node in a shared photodiode. Moreover, a shared reset gate is disposed between two adjacent shared source follower gates.

There are four transfer gates 131/132/133/134 illustrated in FIG. 1. Each transfer gate is disposed between a signal node and a shared sense node. For example, the first transfer gate 131 is disposed between the first signal node 101 and the first shared sense node 121 so that the first signal node 101 and the first shared sense node 121 together serve as a source and a drain which are controlled by the first transfer gate 131. Other transfer gate 132, 133 or 134 functions in a similar way.

There are four transfer gates 231/232/233/234 illustrated in FIG. 2. Each transfer gate is disposed between a signal node and a shared sense node. For example, the first transfer gate 231 is disposed between the first signal node 201 and the first shared sense node 221 so that the first signal node 201 and the first shared sense node 121 together serve as a source and a drain which are controlled by the first transfer gate 231. Other transfer gate 232, 233 or 234 functions in a similar way.

For example, the charge accumulating in a shared photodiode (the shared image sensor 111 or 211) flows from a given signal node (source) towards a given shared sense node (drain) which are controlled by a specific transfer gate so the transfer gate is in charge of the charge transfer from the given signal node (source) towards the given shared sense node (drain).

Further, as shown in FIG. 1, the first shared source follower gate 151 is used to read a photocurrent from the first shared image sensor 111. Similarly, as shown in FIG. 2, the first shared source follower gate 251 is used to read a photocurrent from the first shared image sensor 211. Generally speaking, the function of a shared source follower gate is to read a photo-signal coming from a shared reset gate and is in charge of converting the photo-signal into a voltage signal.

In one embodiment of the present invention, a shared reset gate, the corresponding shared source follower gate and the corresponding transfer gate operate sequentially to control the signal node and the shared sense node. This helps to optimize the operation and the efficiency of a given shared active pixel sensor.

In either a two-shared photodiode or a four-shared photodiode, the shared photodiode has more than one signal node. When more than one signal node is in a "switched on" state, it is not advantageous to detect the photocurrent. Accordingly, in one embodiment of the present invention, only one of the signal nodes in a shared active pixel sensor is switched on at one time to guide the photocurrent to be collected. In another embodiment of the present invention, a shared image sensor may independently operate as if there were multiple pixels present by means of the first signal node and the second signal node. For example, the shared image sensor 111 may independently operate like four pixels when the first signal node 101, the second signal node 102, the third signal node 103 or the fourth signal node 104 is switched on at one time to output the photocurrent to four differently oriented transfer gates 131/132/133/134 because there are four second signal nodes available.

Because the present invention provides a multi-shared image sensor, any single multi-shared image sensor is surely electrically connected to one or more adjacent multi-shared image sensors by means of a shared element. In one embodiment of the present invention, as shown in FIG. 1 or in FIG. 2, the shared active pixel sensor 100 further includes a second shared image sensor 112, an optional third shared image sensor 113 and an optional fourth shared image sensor 114. Similarly, as shown in FIG. 2, the shared active pixel sensor 200 further includes a second shared image sensor 212 and an optional third shared image sensor 213. In another embodiment of the present invention, as shown in FIG. 1 or in FIG. 2, the first shared sense node 121/221 is electrically connected to two transfer gates 131/135 or 231/233 of different shared image sensors 111/112 or 211/212.

Each additional shared image sensor or each optional shared image sensor has similar structures and functions like the first shared image sensor 111 or 211 as described above. For example, in FIG. 1 there are four signal nodes 105/106/107/108, a second shared sense node 122, four transfer gates 135/136/137/138, a second shared reset gate 142 and a second shared source follower gate 152 which correspond to the second shared image sensor 112. Similarly, in FIG. 2, there are two signal nodes 203/204, a second shared sense node 222, two transfer gates 233/234, a second shared reset gate 242 and a second shared source follower gate 252 which correspond to the second shared image sensor 212. Optionally, more optional signal nodes, shared sense nodes, transfer gates, shared reset gates and shared source follower gates are possible.

As shown in FIG. 1, the second shared image sensor 112, the third shared image sensor 113 and the fourth shared image sensor 114 are respectively disposed next to and electrically connected to the previously described first shared image sensor 111. The first shared image sensor 111, the second shared image sensor 112, the third shared image sensor 113 and the fourth shared image sensor 114 share various elements which are directly connected to them.

Take one of the second shared image sensor 112, the third shared image sensor 113 and the fourth shared image sensor 114 for example, the second shared image sensor 112 includes a fifth signal node 105 electrically connected to the first signal node 101 via the first shared sense node 121. The fifth transfer gate 135 is disposed between the fifth signal node 105 and the first shared sense node 121 so that the fifth signal node 105 and the first shared sense node 121 together serve as a source and drain pair controlled by the fifth transfer gate 135.

Similarly, as shown in FIG. 2, the second shared photodiode 212 includes a third signal node 203 electrically connected to the first signal node 201 via the first shared sense node 221. The third transfer gate 233 is disposed between the third signal node 203 and the first shared sense node 221 so that the third signal node 203 and the first shared sense node 221 together serve as a source and drain pair controlled by the third transfer gate 233. Other elements work in a similar way.

As shown in FIG. 1, the second shared source follower gate 152 is used to read a photocurrent from the second shared image sensor 112. Similarly, as shown in FIG. 2, the second shared source follower gate 252 is used to read a photocurrent from the second shared image sensor 212. Generally speaking, the function of a shared source follower gate is to read a photo-signal coming from a shared reset gate and is in charge of converting the photo-signal into a voltage signal.

In view of the above, the present application provides multiple layouts of a multi-share pixel sensor structures. In one aspect, the layouts may minimize the pixel area. In a second aspect, the numbers of the transistors can be reduced. Further, a single multi-share pixel unit may serve as multiple pixels.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shared active pixel sensor (APS), comprising:
    a first shared photodiode comprising at least a first signal node and a second signal node;
    a first shared sense node electrically connected to said first shared photodiode;
    a first transfer gate disposed between said first signal node and said first shared sense node so that said first signal node and said first shared sense node together serve as a source and a drain which are controlled by said first transfer gate;
    a first shared reset gate electrically connected to said first shared sense node; and
    a first shared source follower gate to read a photocurrent from said first shared photodiode.

2. The shared active pixel sensor of claim 1, wherein said first signal node and said second signal node are respectively disposed at different corners of said first shared photodiode.

3. The shared active pixel sensor of claim 1, wherein said first shared photodiode further comprises a third signal node and a fourth signal node.

4. The shared active pixel sensor of claim 1, wherein only one of said first signal node, said second signal node, said third signal node and said fourth signal node is switched on at one time.

5. The shared active pixel sensor of claim 1, wherein said first shared reset gate, said first shared source follower gate and said first transfer gate operate sequentially to control said first signal node and said first shared sense node.

6. The shared active pixel sensor of claim 1, further comprising:
- a second shared photodiode comprising a fifth signal node electrically connected to said first shared sense node;
- a fifth transfer gate disposed between said fifth signal node and said first shared sense node so that said fifth signal node and said first shared sense node together serve as a source and drain pair controlled by said fifth transfer gate; and
- a second shared source follower gate to read a photocurrent from said second shared photodiode.

7. The shared active pixel sensor of claim 6, wherein said first shared sense node is disposed between said second shared source follower gate and said first shared source follower gate.

8. The shared active pixel sensor of claim 6, wherein said first shared sense node is electrically connected to at most four transfer gates of different shared photodiodes.

9. The shared active pixel sensor of claim 6, wherein said first shared reset gate is disposed between said first shared photodiode and said second shared photodiode.

10. The shared active pixel sensor of claim 6, further comprising:
- a second shared sense node electrically connected to said second signal node, and controlled by a second transfer gate of said first shared photodiode, said second transfer gate disposed between said second signal node and said second shared sense node, wherein said second shared sense node is electrically connected to a sixth signal node of said second photodiode and controlled by a sixth transfer gate of said second shared photodiode, said sixth transfer gate disposed between said sixth signal node and said second shared sense node;
- a second shared reset gate electrically connected to said second shared sense node;
- a third shared source follower gate disposed adjacent to said second transfer gate to read a photocurrent from said first shared photodiode; and
- a fourth shared source follower gate disposed adjacent to said sixth transfer gate to read a photocurrent from said second shared photodiode.

11. The shared active pixel sensor of claim 3 independently operated as four pixels by means of said first signal node, said second signal node, said third signal node and said fourth signal node.

* * * * *